(12) United States Patent
Nickel et al.

(10) Patent No.: US 6,911,710 B2
(45) Date of Patent: Jun. 28, 2005

(54) MULTI-BIT MAGNETIC MEMORY CELLS

(75) Inventors: Janice H. Nickel, Sunnyvale, CA (US); Manoj Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 488 days.

(21) Appl. No.: 09/925,755

(22) Filed: Aug. 9, 2001

(65) Prior Publication Data

US 2002/0036331 A1 Mar. 28, 2002

Related U.S. Application Data

(63) Continuation-in-part of application No. 09/522,308, filed on Mar. 9, 2000.

(51) Int. Cl.[7] .............................................. H01L 29/82
(52) U.S. Cl. ........................ 257/421; 365/158; 365/173
(58) Field of Search .......................... 257/421; 365/158, 365/173

(56) References Cited

U.S. PATENT DOCUMENTS

| 5,930,164 A | * | 7/1999 | Zhu ........................... 365/158 |
| 2002/0036331 A1 | | 3/2002 | Bhattacharyya | |

FOREIGN PATENT DOCUMENTS

| EP | 0971423 A | 1/2000 |
| EP | 1132919 A | 9/2001 |

* cited by examiner

*Primary Examiner*—Douglas A. Wille

(57) ABSTRACT

A magnetic memory cell includes first and second magneto-resistive devices connected in series. The first and second magneto-resistive devices have sense layers with different coercivities. Magnetic Random Access Memory (MRAM) devices may include arrays of these memory cells.

12 Claims, 7 Drawing Sheets

MULTI-BIT MAGNETIC MEMORY CELLS

This is a continuation-in-part of U.S. Ser. No. 09/522,308 filed on Mar. 9, 2000, now U.S. Pat. No. 6,590,806.

BACKGROUND

The present invention relates to information storage devices. More specifically, the present invention relates to magnetic memory devices.

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, the MRAM devices are more compact and consume less power than hard drives. MRAM is also being considered for embedded applications such as extremely fast processors and network appliances.

A typical MRAM device includes an array of memory cells, word lines extending along rows of the memory cells, and bit lines extending along columns of the memory cells. Each memory cell is located at a cross point of a word line and a bit line, and typically includes a single magnetic memory device (e.g., a magnetic tunnel junction) having two logic states ('0' and '1').

It is a continuing goal to increase MRAM storage density. Increasing the storage density increases the amount of information that can be stored per unit area.

SUMMARY

According to one aspect of the present invention, a magnetic memory cell includes first and second magneto-resistive devices connected in series. The first and second devices have first and second sense layers with different coercivities. Other aspects and advantages of the present invention will become apparent from the following detailed description, taken in conjunction with the accompanying drawings, illustrating by way of example the principles of the present invention.

DETAILED DESCRIPTION

As shown in the drawings for purposes of illustration, the present invention is embodied in a memory cell including first and second magneto-resistive devices connected in series. These first and second magneto-resistive devices have sense layers with different coercivities and, therefore, different writing points. Thus write operations can be performed selectively on the first and second magneto-resistive devices. Such a memory cell has four logic states; it can store more data than a conventional single-bit memory cell, which has only two logic states. The paragraphs that follow describe different types of magneto-resistive devices, as well as different ways of creating different coercivities.

Figure 1:
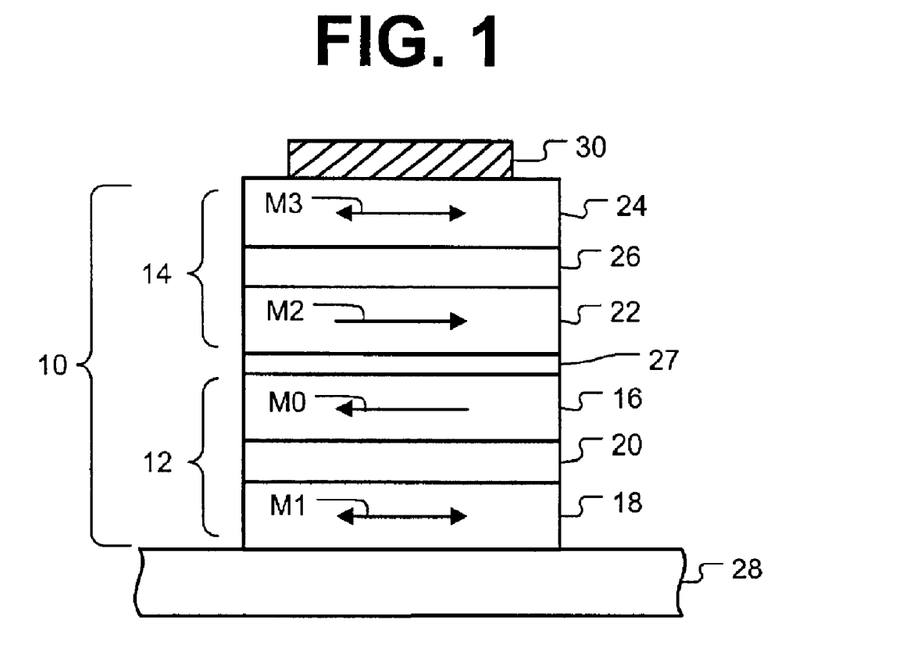
FIG. 1 is an illustration of a multi-bit memory cell according to the present invention.

FIG. 1 shows an exemplary multi-bit memory cell 10 including magnetic tunnel junctions 12 and 14 connected in series. The first magnetic tunnel junction 12 includes a first pinned layer 16, a first sense ferromagnetic (FM) layer 18, and a first insulating tunnel barrier 20 between the first pinned and sense layers 16 and 18. The first pinned layer 16 has a magnetization vector M0 that is oriented in the plane of the first pinned layer 16. The magnetization vector M0 of the first pinned layer 16 is held in one direction, even in the presence of an applied magnetic field in a first range of interest. The first pinned layer 16 may be, for example, a single-layer hard magnet, a multi-layer exchange magnet, or a synthetic antiferromagnet.

The first sense layer 18 has a magnetization vector M1 that is not pinned. Instead, the first sense layer magnetization vector M1 can be oriented in either of two directions in the presence of an applied magnetic field in the first range of interest. The magnetization orientation of the first magnetic tunnel junction 12 is parallel when the sense layer magnetization vector M1 is oriented in the same direction as the pinned layer magnetization vector M0, and it is anti-parallel when the sense layer magnetization vector M1 is oriented in the opposite direction of the pinned layer magnetization vector M0.

The first insulating tunnel barrier 20 allows quantum mechanical tunneling to occur between the first pinned and sense layers 16 and 18. This tunneling phenomenon is electron spin dependent, making the resistance of the first magnetic tunnel junction 12 a function of the relative orientations of the magnetization vectors M0 and M1 of the first pinned and sense layers 16 and 18. For instance, resistance of the first magnetic tunnel junction 12 is a first value (R1) if its magnetization orientation is parallel and a second value (R1+ΔR1) if its magnetization orientation is anti-parallel.

The second magnetic tunnel junction 14 includes a second pinned layer 22, a second sense FM layer 24, and a second insulating tunnel barrier 26 between the second pinned and sense layers 22 and 24. The second pinned layer 22 has a magnetization vector M2 that is oriented in the plane of the second pinned layer 22 and is held in one direction, even in the presence of an applied magnetic field in a second range of interest. The second pinned layer 22 may be, for example, a single-layer hard magnet, a multi-layer exchange magnet, or a synthetic antiferromagnet.

The second sense layer 24 has a magnetization vector M3 that can be oriented in either of two directions in the presence of an applied magnetic field in the second range of interest. Resistance of the second magnetic tunnel junction 14 is a third value (R2) if its magnetization orientation is parallel and a fourth value (R2+ΔR2) if its magnetization orientation is anti-parallel.

A non-magnetic conductive separation layer 27 is located between the first and second junctions 12 and 14. The separation layer 27 has a thickness that prevents magnetic coupling between the first and second tunnel junctions 12 and 14, yet the separation layer 27 allows the tunnel junctions 12 and 14 to be electrically connected. The separation layer 27 may be made of a material such as copper, tantalum, gold or ruthenium. A tantalum separation layer 27 may also function as a seed layer for a second pinned layer 22 made of a compound such as IrMn.

Figure 2:
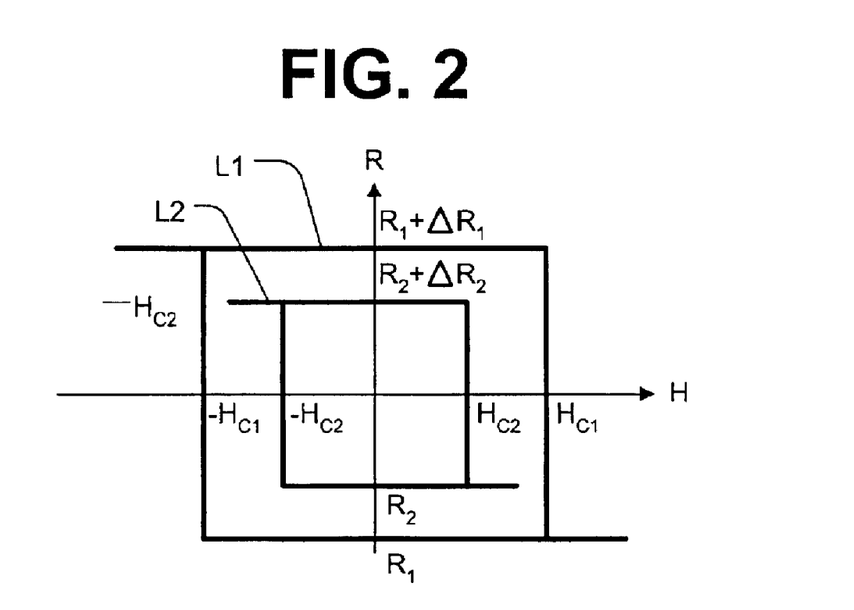
FIG. 2 is an illustration of hysteresis loops for a multi-bit memory cell.

The sense layers 18 and 24 of the first and second magnetic tunnel junctions 12 and 14 have different coercivities. Exemplary hysteresis loops L1 and L2 for the first and second magnetic tunnel junctions 12 and 14 are shown in FIG. 2. As shown in FIG. 2, the first magnetic tunnel junction 12 has a greater coercivity than the second magnetic tunnel junction 14 (i.e., $Hc_1 > Hc_2$). Therefore, the first range of interest is larger than the second range of interest, and a larger magnetic field is needed to change the orientation of the first sense layer magnetization vector M1 than the orientation of the second sense layer magnetization vector M3. The first and second magnetic tunnel junctions 12 and 14 are not limited to hysteresis loops L1 and L2 that are nested, nor are they limited to the first hysteresis loop L1 having a greater coercivity than the second hysteresis loop L2. Moreover, the magneto-resistive devices 12 and 14 should have resistances that allow the four different logic states to be distinguished, as will be explained below.

The multi-bit memory cell 10 is located between first and second conductors 28 and 30. Write currents are supplied to the first and second conductors 28 and 30 to create magnetic fields. The magnetic fields are used to write to the magnetic tunnel junctions 12 and 14. That is, the magnetic fields are used to set the orientations of the sense layer magnetization vectors M1 and M3. Magnitudes of the write currents determine the magnetic field strength, and direction of the write currents determine the direction in which a sense layer magnetization vector is switched.

A logic value may be written to the first magnetic tunnel junction 12 by supplying write currents of appropriate magnitude and direction to the first and second conductors 28 and 30. The resulting magnetic field, which is within the first range of interest, sets the first sense layer magnetization vector M1 in the desired direction. Since the first magnetic tunnel junction 12 has a higher coercivity than that of the second magnetic tunnel junction 14, the resulting magnetic field also sets the second sense layer magnetization vector M3 in the same direction as the first sense layer magnetization vector M1.

A logic value may be written only to the second magnetic tunnel junction 14 by supplying write currents of appropriate magnitude and direction to the first and second conductors 28 and 30. The resulting magnetic field, which is within the second range of interest, sets the second sense layer magnetization vector M3 in the desired direction. Since the second magnetic tunnel junction 12 has a lower coercivity than that of the first magnetic tunnel junction 14, the resulting magnetic field does not change the orientation of the first sense layer magnetization vector M1.

The logic state of the memory cell 10 may be read by applying a voltage across the memory cell 10, and determining the magnitude of a sense current that flows through the memory cell 10. Magnitude of the sense current is proportional to the total resistance of the series-connected junctions 12 and 14. The following table provides an example of the resistance states for the different orientations of the sense layer magnetization vectors M1 and M3 (for M0=→ and M2=←).

| M1 | M3 | Junction Resistance |
|---|---|---|
| → | → | R1 + R2 + ΔR2 |
| → | ← | R1 + R2 |
| ← | → | R1 + ΔR1 + R2 + ΔR2 |
| ← | ← | R1 + ΔR1 + R2 |

If the first and second magnetic tunnel junctions 12 and 14 have the same delta resistance (that is, ΔR1=ΔR2), the resistance state R1+R2+ΔR2 is indistinguishable from the resistance state R1+ΔR1+R2. If the difference in delta resistances is distinguishable, then the memory cell 10 has four distinguishable logic states. The delta resistances may be made different, for example, by making the first and second insulating tunnel barriers 20 and 26 of different thicknesses, or by making the first and second sense layers 18 and 24 of different materials having different polarization.

There are a number of different ways of making first and second sense layers 18 and 24 having different coercivities. For instance, the first and second sense layers 18 and 24 may have different shapes or sizes, they may have different thicknesses, or they may be made of different materials.

A multi-bit memory cell 10 having first and second sense layers made of different materials is shown in FIG. 1. Typical sense layer materials include, but are not limited to NiFe, NiFeCo and CoFe. If the first sense layer 18 is made of NiFeCo or CoFe and the second sense layer 24 is made of NiFe, the first sense layer 18 has a higher coercivity than the second sense layer 24. In general, increasing the percentage of cobalt will increase coercivity.

Figure 3:
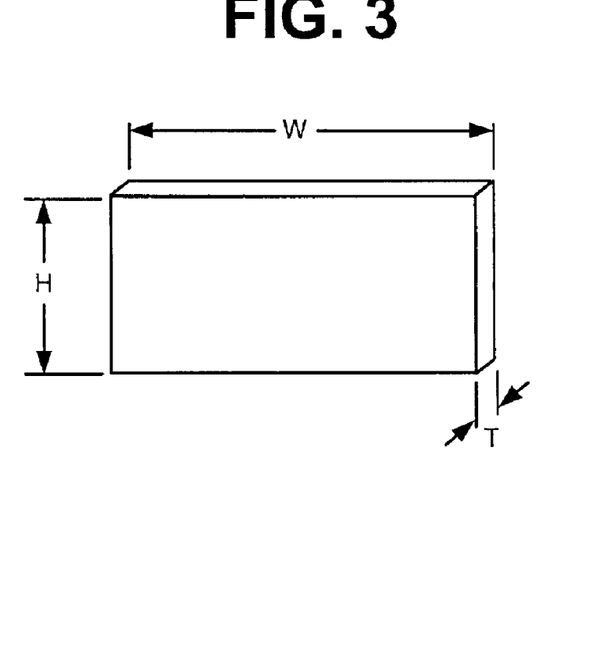
FIG. 3 is an illustration of an exemplary sense layer.

FIG. 3 is an illustration of a rectangular sense layer. Height of the sense layer is denoted by the letter H, width is denoted by the letter W, and thickness is denoted by the letter T. In general, an increase in height, or a reduction in width (W) or thickness (T) will result in a lower coercivity.

Figure 4:
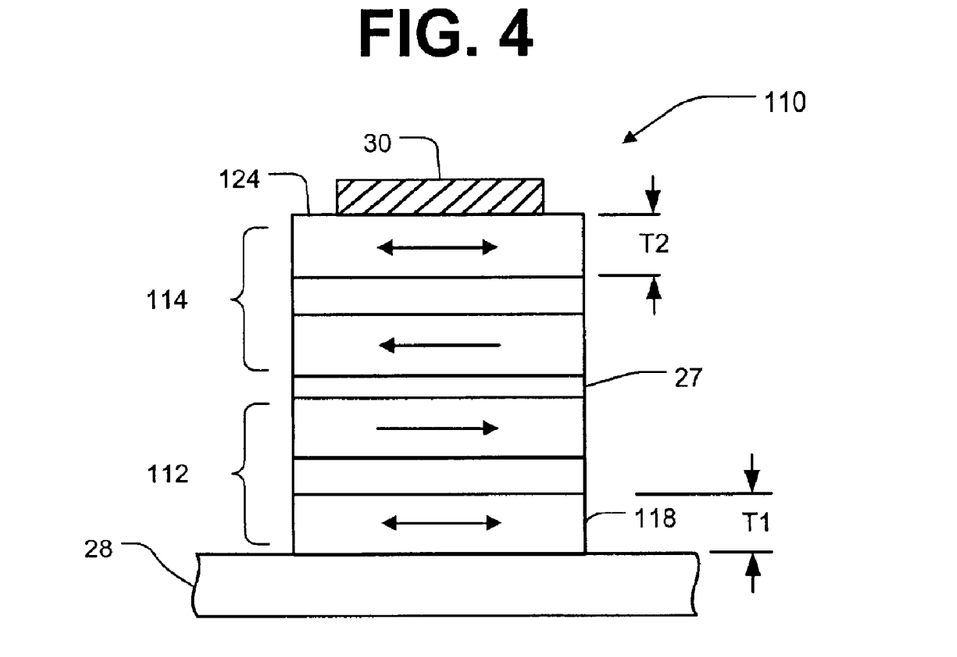
FIGS. 4–10 are illustrations of other multi-bit memory cells according to the present invention.

A memory cell 110 including first and second sense layers 118 and 124 having different thicknesses is shown in FIG. 4. Thickness of the first sense layer 118 is denoted by T1, and thickness of the second sense layer 124 is denoted by T2. If T1>T2 and the sense layers 118 and 124 are otherwise the same, the sense layer 118 of the first magnetic tunnel junction 112 has a higher coercivity than the sense layer 124 of the second magnetic tunnel junction 114.

Figure 5:
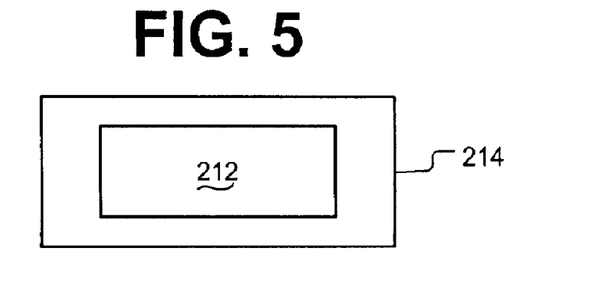
Figure 6:
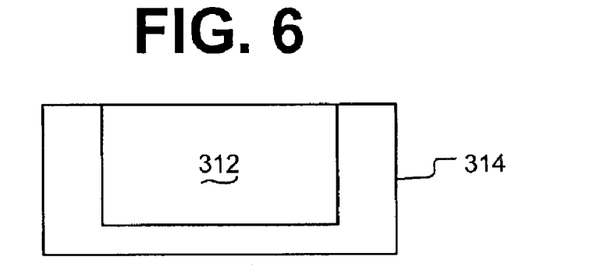
Figure 7:
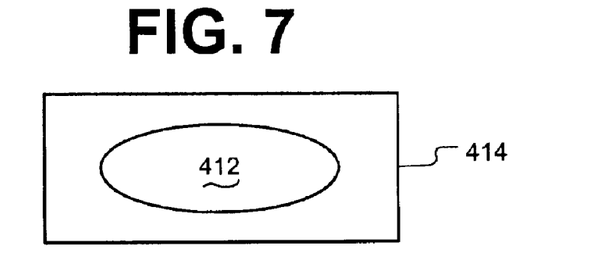
Figure 8:
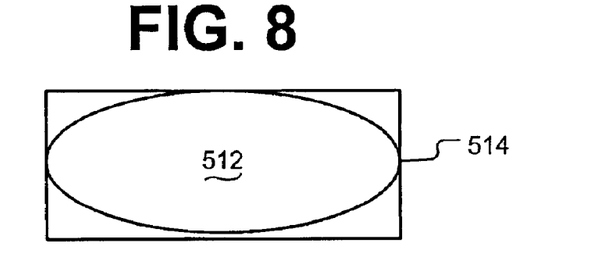

FIG. 5 shows first and second magnetic tunnel junctions 212 and 214 having the same shapes and different sizes. FIG. 6 also shows first and second magnetic tunnel junctions 312 and 314 having the same shapes and different sizes. FIG. 7 shows first and second magnetic tunnel junctions 412 and 414 having different shapes and different sizes. FIG. 8 shows first and second magnetic tunnel junctions 512 and 514 having different shapes and the same size. Different sizes may include different lengths and widths.

The magnetic junctions are not limited to rectangular and elliptical shapes. For example, the magnetic tunnel junctions could have a square shape, or a complex shape such as a diamond, parallelogram, rhombus or any symmetric or asymmetric polygon.

A multi-bit memory cell is not limited to each junction having a different shape or size. For example, the pinned layer and insulating tunnel barrier of the second magnetic tunnel junction may have the same shape and size as the underlying first magnetic tunnel junction, but only the sense FM layer of the second magnetic tunnel junction has a different shape or size.

Generally, the second (upper) magnetic tunnel will have the smaller shape and size. This results from manufacturing considerations, which will be discussed below.

The coercivities of the sense layers of the first and second magnetic tunnel junctions may be made different by any combination of different thicknesses, different shapes, different sizes and different materials. The magnitude of these differences limits the ability to control magnitudes of write fields.

Figure 9:
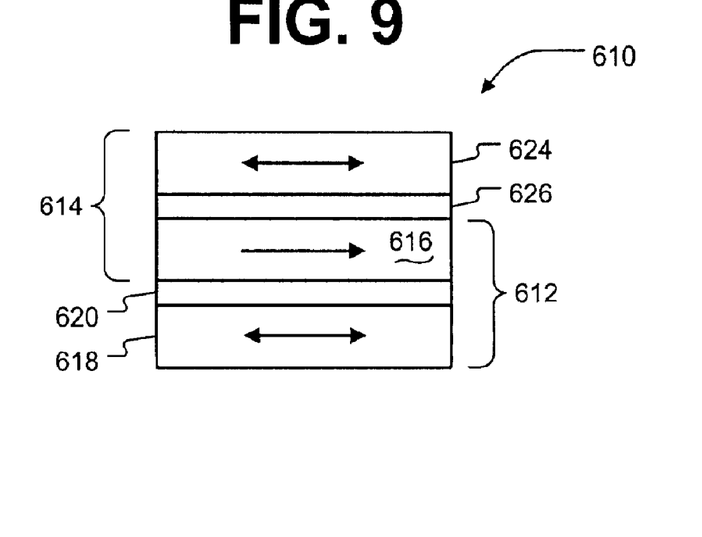

FIG. 9 shows a multi-bit memory cell 610 including first and second magnetic tunnel junctions 612 and 614 that share a pinned layer 616. The pinned layer 616 may be a hard magnet. Thus, the first magnetic tunnel junction 612 includes a first sense layer 618, a first insulating tunnel barrier 620, and the shared pinned layer 616; and the second magnetic tunnel junction 614 includes a second sense layer 624, a second insulating tunnel barrier 626, and the shared pinned layer 616. Coercivities of the first and second magnetic tunnel junctions 612 and 614 may be made different by making the first and second sense layers 618 and 624 of different thickness, size, shape and material, or any combination thereof.

The pinned layers are not limited to any particular design. The pinned layers may be hard magnets. More commonly, however, each pinned layer will include a stack of elements. For example, the stack may includes one or more seed layers, an anti-ferromagnetic (AF) pinning layer, and a pinned FM layer. The seed layer or layers establishes a (111) or other preferred crystal structure orientation for the AF pinning layer, and the AF pinning layer provides a large exchange field, which holds the pinned layer magnetization vector. Seed layers are not always needed. High energy deposition can be used to create texture on the pinned layer for exchange coupling.

A pinned layer with appropriate texture to create a magnetic exchange field can be grown on top of its corresponding sense layer. Texturing techniques are used in the fabrication of magneto-resistive read heads.

A multi-bit memory cell is not limited to two magneto-resistive devices. For example, a multi-bit memory cell may have three magneto-resistive devices. Such a memory cell has eight logic states.

The magneto-resistive devices are not limited to insulating tunnel barriers deposited on pinned FM layers, and sense FM layers deposited on insulating tunnel barriers. The ordering may be different.

Figure 10:
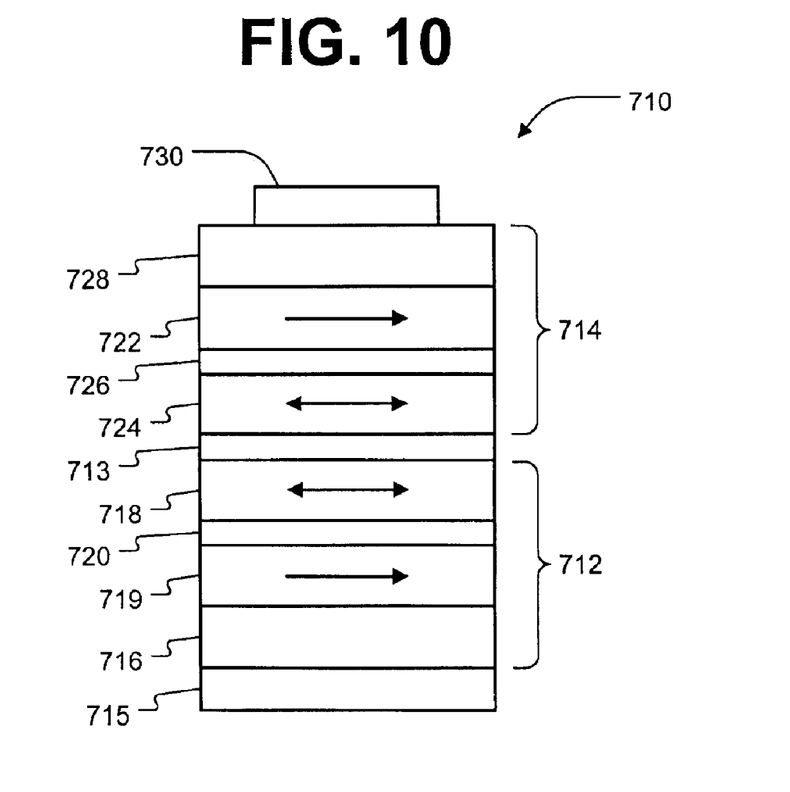

FIG. 10 shows a memory cell 710 including first and second magnetic tunnel junctions 712 and 714 having first and second sense layers 718 and 724 that are connected in series. The first and second sense layers 718 and 724 are separated by a layer 713 of non-magnetic material (e.g., ruthenium, copper, aluminum), which electrically connects the two magneto-resistive devices 712 and 714. The layer 713 also decouples magnetizations of the two sense layers 718 and 724. The memory cell 710 may have the following exemplary construction: a first IrMn pinning layer 716 deposited on tantalum 715, a first NiFe FM pinned layer 719 on the pinning layer 716, a first $Al_2O_3$ insulating tunnel barrier 720 deposited on the first pinned layer 719, a first NiFe sense layer 718 deposited on the first insulating tunnel barrier 720, an Ru layer 713 deposited on the first sense layer 718, a second NiFe sense layer 724 deposited on the Ru layer 713, a second $Al_2O_3$ insulating tunneling barrier 726 deposited on the second sense layer 724, a second NiFe pinned layer 722 deposited on the second tunneling barrier 726, a second IrMn pinning layer 728 deposited on the second pinned layer 722, and a tantalum cap 730 deposited on the second pinning layer 728.

The multi-bit memory cells are not limited to magnetic tunnel junctions. Other magneto-resistive devices, such as giant magneto-resistive (GMR) devices may be used. A multi-bit memory cell based on multiple GMR devices may have any of the configurations described above, except that sense and pinned layers are separated by a conductive non-magnetic metallic layer instead of an insulating tunnel barrier. The relative orientations of the sense and pinned layer magnetization vectors affect in-plane resistance of a GMR device.

Figure 11:
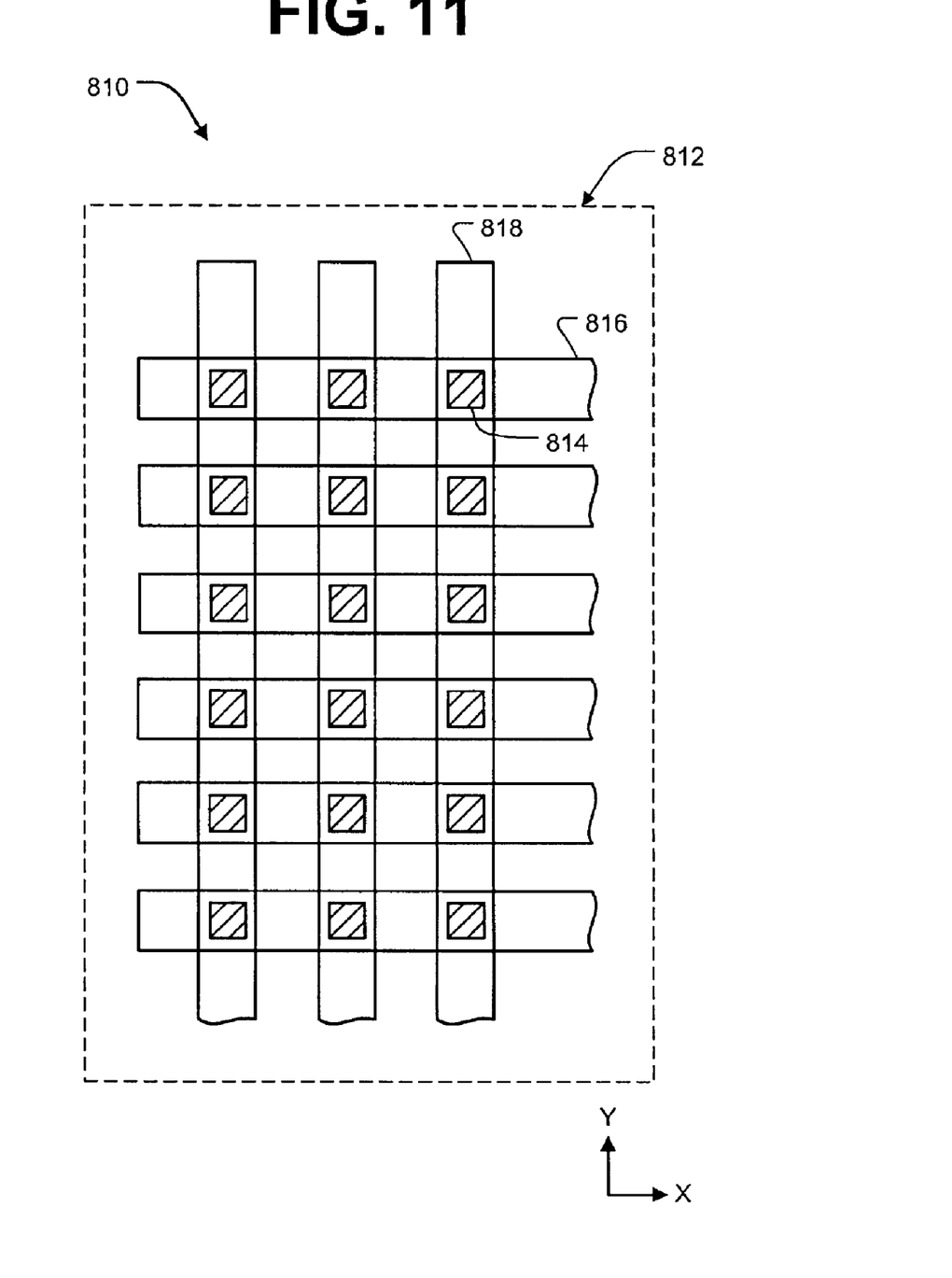
FIG. 11 is an illustration of an MRAM device including an array of multi-bit memory cells.

Referring to FIG. 11, an MRAM device 810 includes a resistive cross point array 812 of multi-bit memory cells 814. The memory cells 814 are arranged in rows and columns, with the rows extending along an x-direction and the columns extending along a y-direction. Only a relatively small number of the memory cells 814 are shown to simplify the illustration of the MRAM device 810. In practice, arrays of any size may be used.

Traces functioning as word lines 816 extend along the x-direction in a plane on one side of the array 812. Traces functioning as bit lines 818 extend along the y-direction in a plane on an adjacent side of the array 812. There may be one word line 816 for each row of the array 812 and one bit line 818 for each column of the array 812. Each memory cell 814 is located at a cross point of a word line and a bit line. The MRAM device 812 includes a read/write circuit (not shown) for sensing the resistance states of selected memory cells during read operations and for supplying write currents to selected word and bit lines during write operations.

The difference in coercivity between the first and second tunnel junctions of the array 812 will depend upon their switching distributions (that is, how uniformly they switch). Larger distributions will require larger differences between the average coercivity of the first magnetic tunnel junctions ($Hc_{AVE1}$) in the array 812 and the average coercivity of the second magnetic tunnel junctions ($Hc_{AVE2}$) in the array 812. For example, if the average coercivity of the first magnetic tunnel junctions is $Hc_{AVE1}$=10 Oe with a distribution of 5 Oe, and the average coercivity of the second magnetic tunnel junctions is $Hc_{AVE2}$=20 Oe with a distribution of 5 Oe, some memory cells will not be able to distinguish between the first and second magnetic tunnel junctions. Therefore, a higher average coercivity ($Hc_{AVE2}$) for the second magnetic tunnel junctions would be used.

Figure 12:
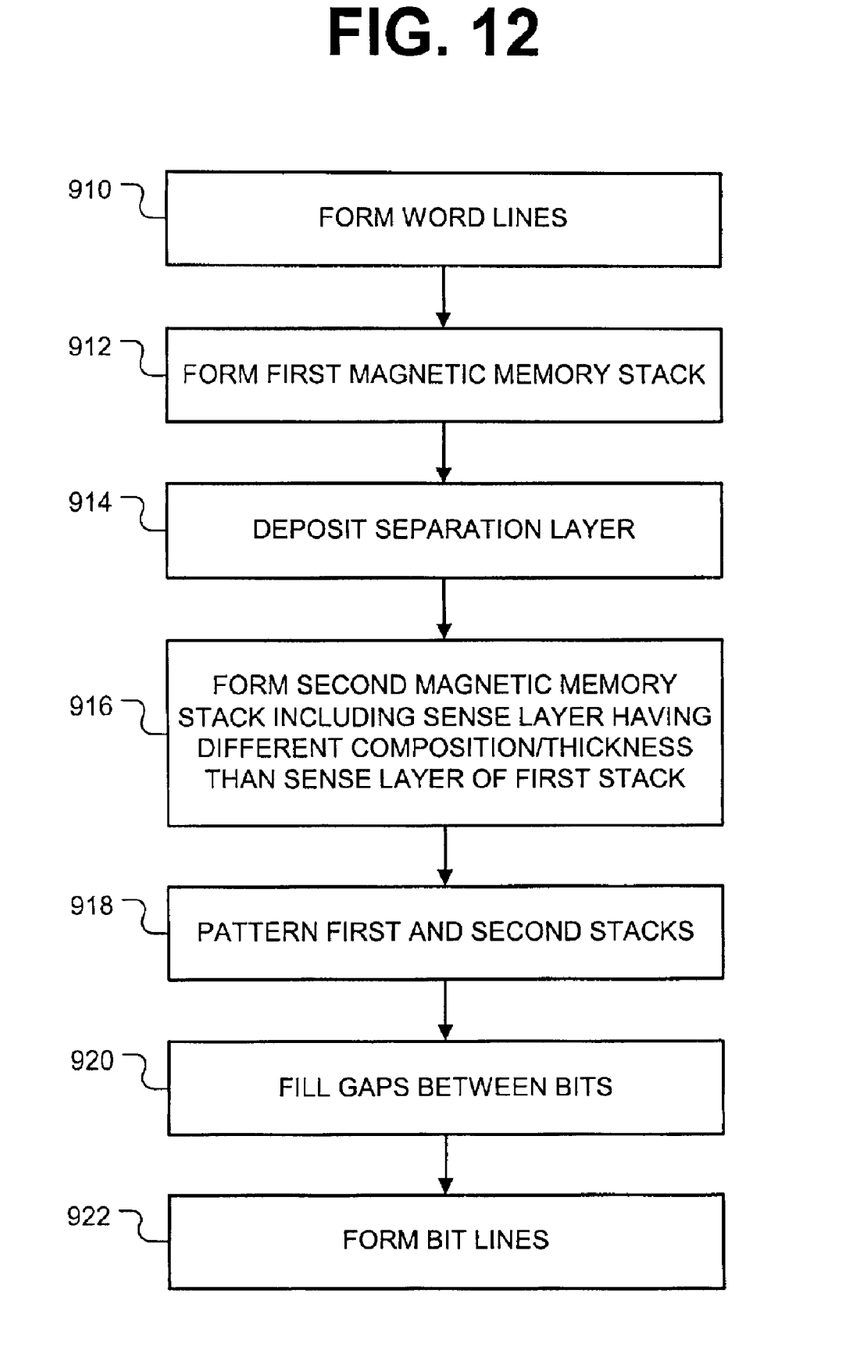
FIGS. 12 and 13 are illustrations of different methods of manufacturing the device of FIG. 11.

FIG. 12 illustrates the fabrication of an MRAM device including an array of multi-bit memory cells having magneto-resistive devices made of different materials. Word lines are formed on a wafer (910), and a first magnetic memory layer stack is formed on the word lines (912). A non-magnetic conductive separation layer is deposited on the first magnetic memory layer stack (914).

A second magnetic memory layer stack is formed on the separation layer (916). A sense layer of the second stack is made of a different material or thickness than a sense layer of the first stack.

The first and second stacks are patterned into bits (918), and gaps between the bits are filled in with a dielectric material (920). Bit lines are formed over the patterned second stack (922).

Figure 13:
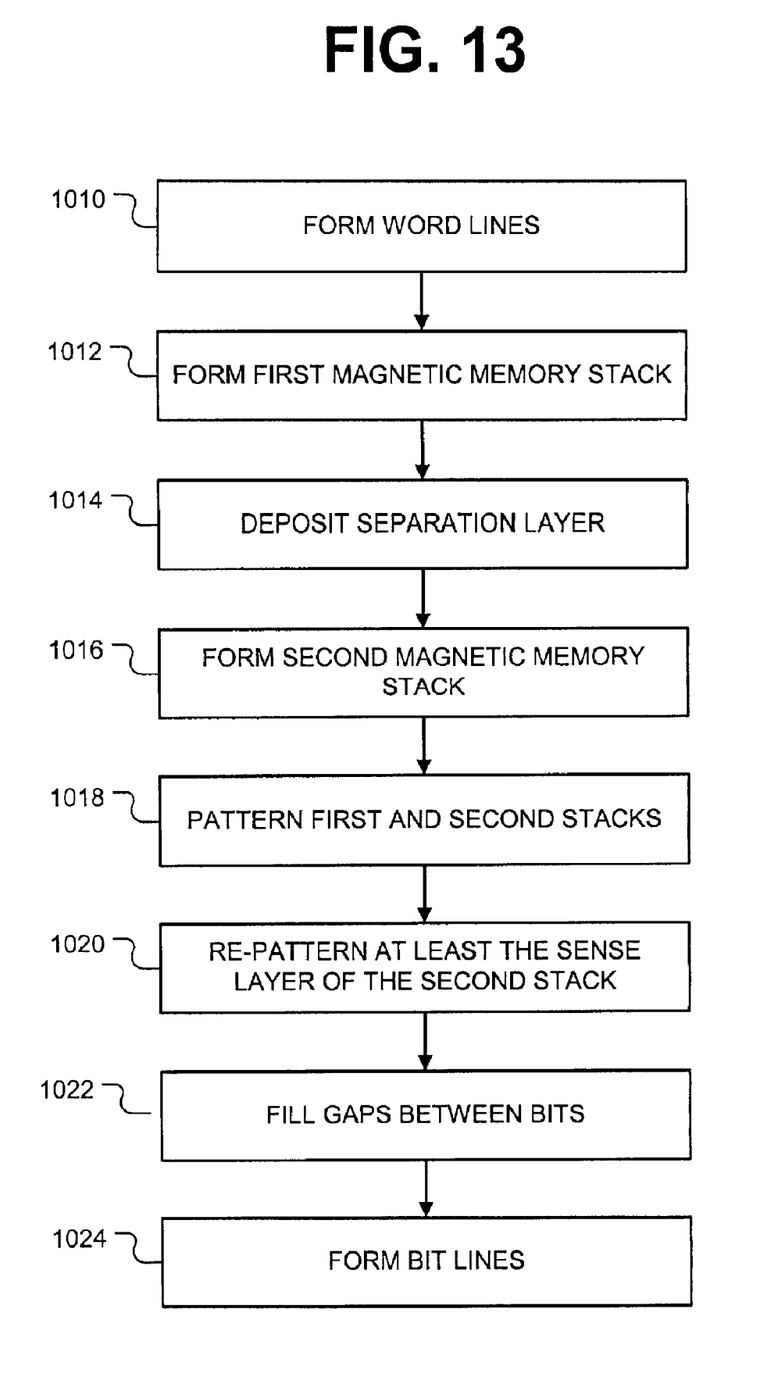

FIG. 13 illustrates the fabrication of an MRAM device including an array of multi-bit memory cells having magneto-resistive devices of different sizes and/or shapes. Word lines are formed on a wafer (1010), a first magnetic memory layer stack is formed on the word lines (1012), a separation layer is deposited on the first magnetic memory layer stack (1014), and a second magnetic memory layer stack is formed on the separation layer (1016). The layers of the first stack may have the same composition as the layers of the second stack.

A first masking step is used to pattern the first and second stacks into a first size and/or shape (1018), and a second masking step is used to re-pattern at least the sense layer of the second stack into a second size and/or shape (1020). Gaps between the bits are filled with a dielectric material (1022), and bit lines are formed over the patterned second stack (1024).

The memory cells are not limited to the pinned layers described above. Another type of memory cell may include a synthetic ferrimagnet pinned layer. Structure of this memory cell is similar to that shown in FIG. 1, except that the separation layer 27 is made of a material such as Ru, Re, Rh or Cu and has a thickness that allows magnetic exchange coupling between the two pinned layer 16 and 22. The exchange coupling between the magnetization vectors of the two pinned layers 16 and 22 is very strong.

The memory cells are not limited to magnetic tunnel junctions and GMR devices. Other types of magnetic memory elements, such as colossal magneto-resistive (CMR) elements, may be used.

The MRAM devices according to the present invention may be used in a wide variety of applications. For example, they may replace DRAM, SDRAM, flash, and other fast, short-term memory in computers. They may be used for long-term data storage in a computer. The MRAM devices offer many advantages (e.g., faster speed, smaller size) over hard drives and other conventional long-term data storage devices. The MRAM devices according to the present invention may be used in digital cameras for long-term storage of digital images.

The present invention is not limited to the specific embodiments described and illustrated above. Instead, the present invention is construed according to the claims that follow.

What is claimed is:

1. A magnetic memory cell comprising first and second magneto-resistive devices connected in series, the first magneto-resistive device having a first sense layer, the second magneto-resistive device having a second sense layer, the first and second sense layers having different coercivities and at least one of having different sizes and different material compositions.

2. The memory cell of claim 1, wherein the first and second devices are magnetic tunnel junctions.

3. The memory cell of claim 1, wherein the sense layers in the first and second devices have different shapes.

4. The memory cell of claim 1, wherein the sense layers in the first and second devices have different sizes.

5. The memory cell of claim 1, wherein the sense layers of the first and second devices have different shapes and sizes.

6. The memory cell of claim 1, wherein the sense layers of the first and second devices have different thicknesses.

7. The memory cell of claim 1, wherein the sense layers of the first and second devices are made of different materials.

8. The memory device of claim 1, wherein the first and second devices have distinguishably different delta resistances, whereby the memory cell has at least four distinguishable logic states.

9. A magnetic memory cell comprising first and second magnetic tunnel junctions connected in series, the first magnetic tunnel junction having a first sense layer, the second magnetic tunnel junction having a second sense layer, the first and second sense layers having different coercivities, the first and second magnetic tunnel junctions sharing a pinned layer.

10. The memory cell of claim 9, wherein the first magnetic tunnel junction includes the first sense layer and a first pinned layer; and wherein the second magnetic tunnel junction includes the second sense layer end a second pinned layer.

11. The memory cell of claim 9, wherein the sense layers of the first and second devices are back to back; and wherein the sense layers are separated by a layer of non-magnetic material.

12. The memory cell of claim 9, wherein hysteresis loops of the first and second junctions are nested.

* * * * *